(12) United States Patent
Guthrie

(10) Patent No.: US 6,424,213 B1
(45) Date of Patent: Jul. 23, 2002

(54) LOSS REDUCTION USING MULTIPLE AMPLIFIERS IDENTICALLY DIVIDED

(75) Inventor: Warren Guthrie, West Olive, MI (US)

(73) Assignee: Netcom, Inc., Wheeling, IL (US)

( * ) Notice: Subject to any disclaimer, the term of this patent is extended or adjusted under 35 U.S.C. 154(b) by 0 days.

(21) Appl. No.: 09/659,982

(22) Filed: Sep. 12, 2000

Related U.S. Application Data (60) Provisional application No. 60/199,054, filed on Apr. 22, 2000, now abandoned.

(51) Int. Cl.[7] .................................................. H03F 1/26
(52) U.S. Cl. ....................................... 330/149; 330/151
(58) Field of Search ................................... 330/149, 151

(56) References Cited

U.S. PATENT DOCUMENTS

| | | |
|---|---|---|
| 3,906,401 A | 9/1975 | Seidel |
| 4,379,994 A | 4/1983 | Bauman |
| 4,583,049 A | 4/1986 | Powell |
| 4,591,800 A | 5/1986 | Opas |
| 4,595,882 A | 6/1986 | Silagi et al. |
| 4,629,996 A | 12/1986 | Watanabe et al. |
| 4,879,519 A | 11/1989 | Myer |
| 4,926,136 A | 5/1990 | Olver |
| 5,077,532 A | 12/1991 | Obermann et al. |
| 5,157,345 A | 10/1992 | Kenington et al. |
| 5,304,945 A | 4/1994 | Myer |
| 5,376,899 A | 12/1994 | Pass |
| 5,444,418 A | 8/1995 | Mitzlaff |
| 5,485,120 A | 1/1996 | Anvari |
| 5,570,063 A | 10/1996 | Eisenberg |
| 5,594,385 A | 1/1997 | Anvari |
| 5,619,168 A | 4/1997 | Myer |
| 5,623,227 A | 4/1997 | Everline et al. |
| 5,675,288 A | 10/1997 | Peyrotte et al. |
| 5,757,231 A | 5/1998 | Tozawa |
| 5,760,646 A | 6/1998 | Belcher et al. |
| 5,838,195 A | 11/1998 | Szmurlo et al. |
| 5,867,064 A | 2/1999 | Van Horn et al. |
| 5,874,856 A | 2/1999 | Van Horn |
| 5,912,586 A | 6/1999 | Mitzlaff |
| 5,917,375 A | 6/1999 | Lisco et al. |
| 5,963,091 A | 10/1999 | Chen et al. |
| 5,977,825 A | 11/1999 | Mueck |
| 5,977,826 A | 11/1999 | Behan et al. |

FOREIGN PATENT DOCUMENTS

EP 1 030 441 * 8/2000

* cited by examiner

Primary Examiner—Steven J. Mottola
(74) Attorney, Agent, or Firm—Michael Best & Friedrich LLP (57) ABSTRACT

An amplifier and method of canceling distortion in an amplified signal. The amplifier includes a main amplifier operable to receive a main input signal and generate an amplified signal having a main component and an error component. The amplifier also includes a plurality of error correction amplifiers coupled in a feed-forward arrangement to the main amplifier and operable to receive an input signal and to generate a plurality of output signals, each having a main component and an error component. A balancing network is coupled to the main amplifier and to the plurality of error canceling amplifiers. The balancing network isolates a sample of the output signal of the main amplifier, inverts the sample, and combines the sample with the input signal to the error correction amplifiers. An N+1, unequal combiner combines the output signal from the main amplifier and the output signals of the error correction amplifiers such that the error components of the output signals substantially cancel one another and the main components of the output signals are added to one another. The method involves dividing an input signal into a first component and a second component, amplifying the first component of the input signal to create an output signal, sampling the output signal to create a sampled signal, combining the sampled signal and the second component of the input signal to create a combined signal, amplifying the combined signal using a plurality of error correction amplifiers to create a plurality of correction signals; and combining the output signal and the correction signals in an unequal combiner to create an amplified signal.

24 Claims, 5 Drawing Sheets

LOSS REDUCTION USING MULTIPLE AMPLIFIERS IDENTICALLY DIVIDED

RELATED APPLICATIONS

This application claims the benefit of prior filed provisional patent application No. 60/199,054 filed on Apr. 22, 2000 now abandoned.

BACKGROUND OF THE INVENTION

The present invention relates to distortion or error canceling amplifiers. More particularly, the invention relates to reducing the loss of power that occurs in the signal path directed through the main amplifier of an error correction amplifier.

Modem digital communications systems provide high spectral efficiency, clarity, and fade resistance that is unmatched by older analog systems. Nevertheless, increasing consumer demand requires even better systems. To achieve further improvements in performance, communications systems such as CDMA (code division multiple access) and GSM (global system for mobile communication) will require amplifiers that provide relatively high-power signals. There are a number of different ways of achieving relatively high-power signals, but many known methods are not energy efficient. Modern communication systems also require amplifiers with limited or minimal spectral regrowth. (As is known, spectral regrowth refers to the amplification of signals outside a desired frequency range. Ideally, an amplifier would amplify signals without creating noise, particularly noise outside the frequency range of the input signal. In practice, this ideal has not yet been achieved.) Spectral regrowth often causes interference between adjacent communication channels. Limiting or reducing spectral regrowth is an important factor to improving spectral efficiency. When spectral regrowth is low, interference is reduced. With reduced interference, channel separation may be narrowed and the number of channels in a given bandwidth may be increased.

Simple class A and class AB amplifiers have been used in communications applications. When using a class A or class AB amplifier, spectral regrowth can be controlled by operating a simple amplifier at 8 to 10 dB below compression (the point where the amplifier clips or saturates). However, simple class A and class AB amplifiers are not well suited for providing high-power signals. Class A and class AB amplifiers waste about 90% of the available output power.

Figure 1:
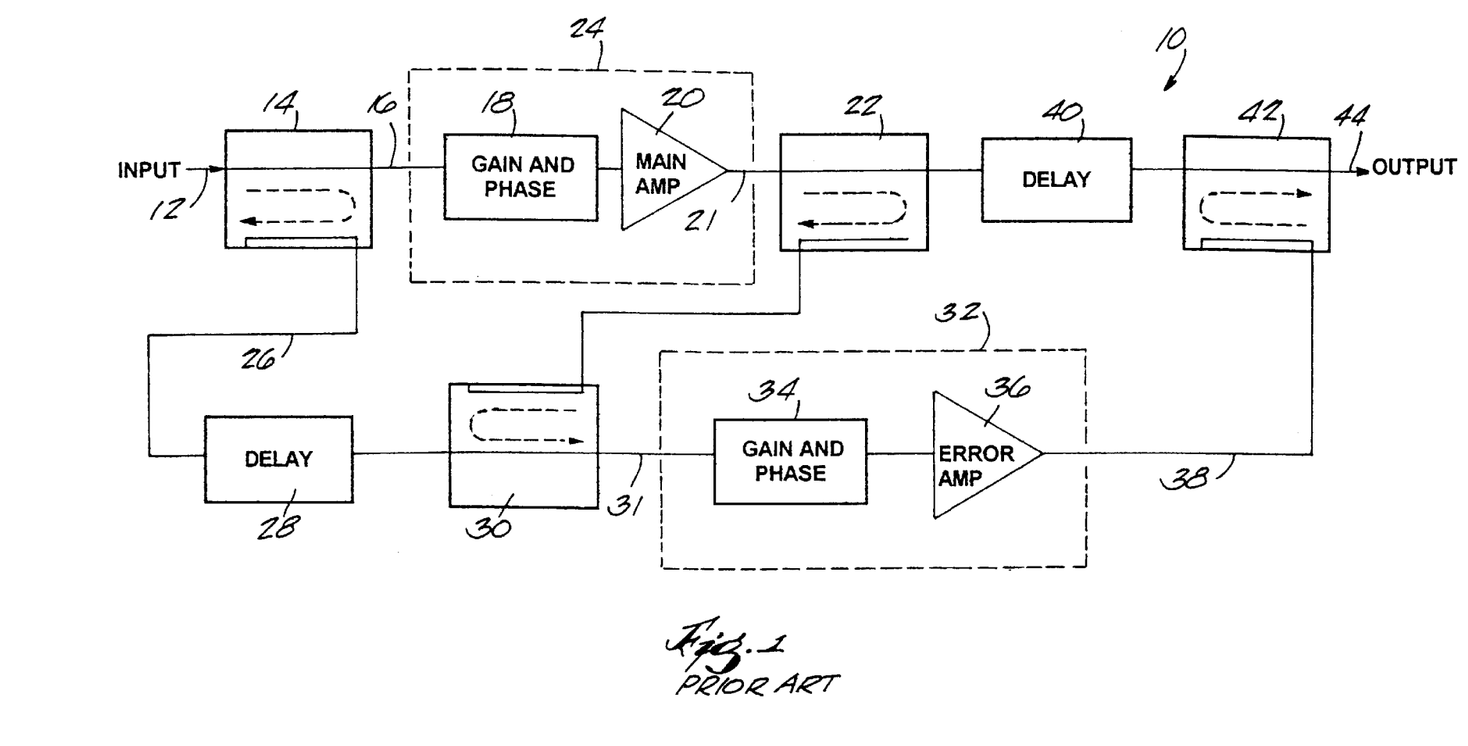
FIG. 1 is a circuit diagram of a feed-forward amplifier ("FFA") of the prior art.

Another type of amplifier, a feed-forward amplifier, can be operated at higher power levels with higher efficiency. Feed-forward amplifiers ("FFAs") use two amplifiers: a main amplifier and a distortion-canceling amplifier. The main amplifier is operated at a relatively high power level and generates an amplified, but distorted or noisy signal. A feed-forward circuit or path is used to estimate the distortion generated by the main amplifier. The estimated distortion is inverted, amplified, and then summed with the output from the main amplifier to remove the distortion in the amplified signal. An exemplary feed-forward amplifier 10 is shown in FIG. 1.

The amplifier 10 receives an input signal 12. The input signal 12 is delivered to a coupler 14. The coupler 14 outputs a signal 16 to a gain and phase block 18. The output of the gain and phase block 18 is delivered to a main amplifier 20, which could be a class A or class AB amplifier. The main amplifier 20 amplifies the input signal 12 by a predetermined gain and outputs an amplified signal 21 to a coupler 22. The amplified signal 21 includes a main signal component (the amplified input signal 12) and a noise or error component. The gain and phase control block 18 and main amplifier 20 comprise a main signal path 24.

The coupler 14 outputs a second signal 26 that is delivered to a delay 28. The amount of time delay presented by the delay 28 is approximately equal to the time required for the signal 16 to propagate through the main signal path 24. The delayed output signal of the delay 28 is delivered to a coupler 30. The coupler 30 also receives an input from the coupler 22. Each signal entering the coupler 30 is phased such that the main signal component in each input signal is canceled (or nearly canceled), leaving only an error signal 31 (the distortion created by the main amplifier 20). The coupler 30 outputs the error signal to an error path 32 that includes a gain and phase block 34 and an error or distortion canceling amplifier 36. The error path 32 generates a second error signal 38. The second error signal 38 is a gain and phase adjusted version of the signal 31. At the output, the amplitude of the second signal 38 matches or nearly matches the amplitude of the error component of the signal 21. Also, the second signal 38 is 180° out-of-phase with the error component of the signal 21.

The signal 21 is output by the coupler 22 to an error delay 40. The error delay 40 provides a time delay approximately equal to the time it takes for the error signal 31 to propagate through the error path 32. The delayed signal from the error delay 40 and the error signal 38 are input to a coupler 42. The two signals are combined in the coupler 42 and, due to the phase and gain adjustments made to each, the error signal 38 substantially cancels the error component of the signal 21, creating an output signal 44 with only the main component of the original input signal 12.

While FFAs provide improved amplification over simple amplifiers, FFAs are still relatively inefficient. Loses in the final coupler (i.e., coupler 42) of an FFA waste a large amount of the error signal. In addition, the distortion amplifier in an FFA requires a relatively high power output capability to prevent the error amplifier from creating a significant level of independent distortion.

Balanced Error Correction ("BEC") amplifiers are related to FFAs, but provide higher output power and reduced spectral regrowth. A BEC amplifier includes a main amplifier that receives a main input signal and generates an amplified signal having a main component and an error component. A BEC amplifier also includes a second or error-canceling amplifier coupled in a feed-forward arrangement to the main amplifier. The error-canceling amplifier receives an input signal and generates an output signal having a main component and an error component. A balancing network is coupled to the main amplifier and to the error-canceling amplifier. The balancing network isolates a sample of the output signal of the main amplifier, inverts the sample, and combines the sample with the input signal to the error-canceling amplifier. A summing point combines the output signal from the main amplifier and the output signal of the error correction amplifier such that the error components of the two output signals substantially cancel one another and the main components of the output signals are added to one another to produce an output signal with almost twice the power of a typical FFA.

SUMMARY OF THE INVENTION

Despite the improved performance provided by a BEC amplifier as compared to an FFA, the inventor has discovered that a BEC amplifier has several inefficiencies. One of the inefficiencies or source of losses in a BEC amplifier is the path through the main amplifier. Accordingly, there is a need for improved an amplifier.

The present invention provides a highly efficient, linear amplifier for communications and other applications. The amplifier includes a main amplifier operable to receive an input signal and generate an amplified signal having a main component and an error component. A plurality of error amplifiers, each coupled in parallel with one another, is coupled in a feed-forward arrangement to the main amplifier and operable to receive a second input signal. Each of the plurality of error amplifiers generates an output signal having a main component and an error component. A balancing network is coupled to the main amplifier and to the plurality of error amplifiers. The balancing network isolates a sample of the error component of the amplified signal, inverts the sample, and combines the sample with the input signal to the plurality of error amplifiers. An unequal combiner is coupled to the balancing network and combines the amplified signal from the main amplifier and the output signal of each of the plurality of error amplifiers such that the error components of the amplified signal and the output signals of the plurality of error amplifiers substantially cancel one another and the main components of the amplified signal and the output signals are added to one another.

The main amplifier and the error amplifiers are all similar in both gain and distortion characteristics.

The invention also provides a method including the acts of dividing an input signal into a first component and a second component, amplifying the first component of the input signal to create an output signal, sampling the output signal to create a sampled signal, combining the sampled signal and the second component of the input signal to create a combined signal, amplifying the combined signal using a plurality of error correction amplifiers to create a plurality of correction signals, and combining the output signal and the correction signals in an unequal combiner to create an amplified signal.

The method may also include the act of passing the output signal of the main amplifier through lossy elements having a gain that is substantially equal to the gain in a branch of the unequal combiner. Further acts in the method may include adjusting the phase of the first component and adjusting the phase and gain of the sampled signal.

As is apparent from the above, it is an advantage of the present invention to provide an efficient amplifier. Other features and advantages of the present invention will become apparent by consideration of the detailed description and accompanying drawings.

DETAILED DESCRIPTION

Before one embodiment of the invention is explained in detail, it is to be understood that the invention is not limited in its application to the details of the construction and the arrangements of the components set forth in the following description or illustrated in the drawings. The invention is capable of other embodiments and of being practiced or being carried out in various ways. Also, it is to be understood that the phraseology and terminology used herein is for the purpose of description and should not be regarded as limiting. In particular, it should be understood that the present invention is not limited to applications in communications, but may be used in a wide variety of applications where amplifiers are needed.

Figure 2:
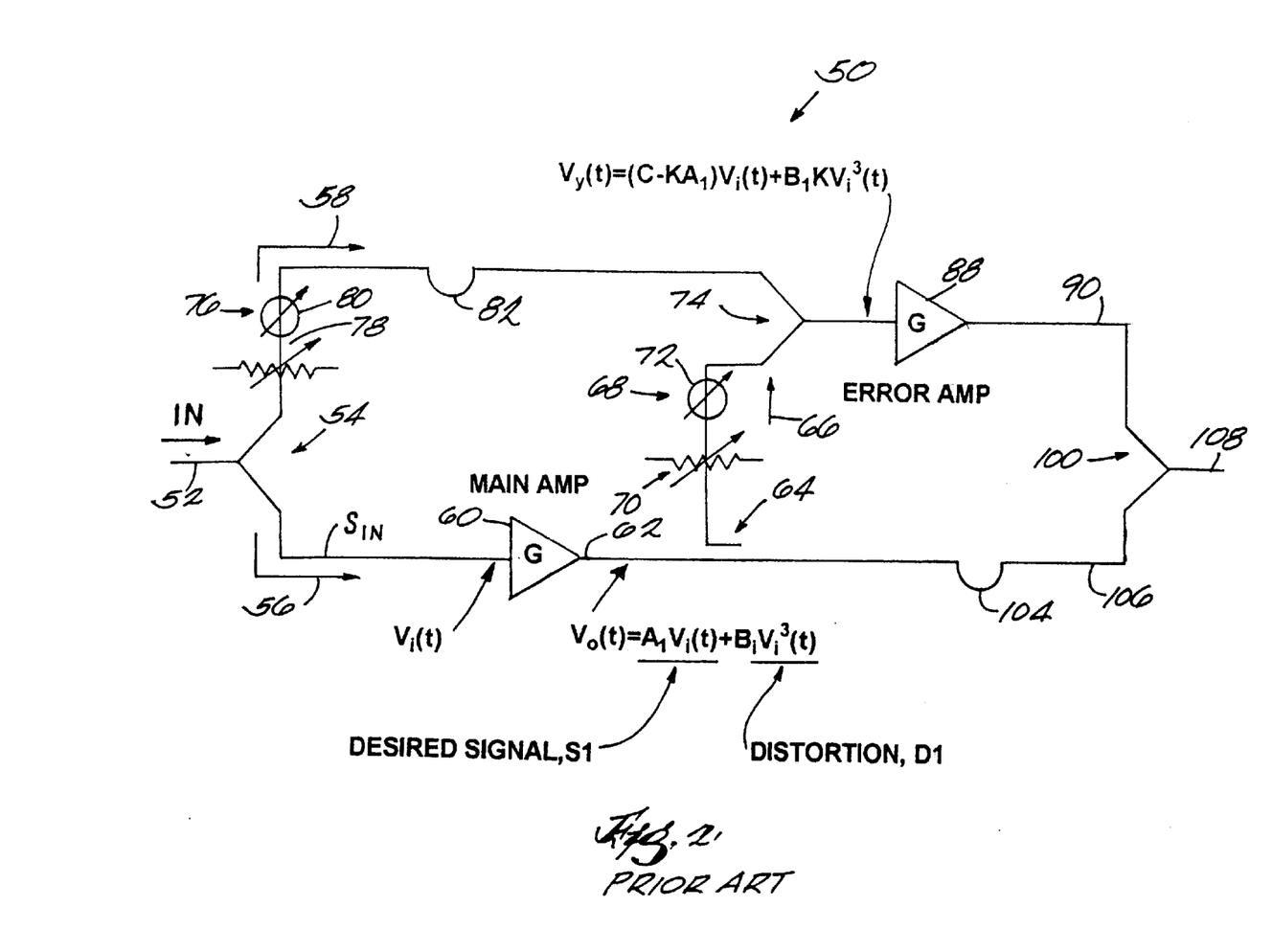
FIG. 2 is a circuit diagram of a balanced error correction ("BEC") amplifier.

FIG. 2 illustrates a BEC amplifier 50. The BEC amplifier 50 receives an input signal IN at an input node 52. The input signal IN is split by a coupler 54 causing the input signal IN to be directed to a main path 56 and an error path 58. A signal $S_{IN}$ is directed to the main path 56 and is amplified by a main amplifier 60 having a gain G. The main amplifier 60 generates an amplified signal 62 having a main or desired signal component $A_1 V_i(t)$ and an error or noise component $B_1 V_{i3}(t)$. The amplified signal 62 is split by a coupler 64 that causes part of the amplified signal to be diverted down a feed-forward path 66 to a gain and phase control block or assembly 68. The gain and phase control assembly 68 includes a gain control amplifier 70 having an adjustable gain. The gain and phase control assembly 68 also has a phase adjuster 72 that provides phase adjustment to compensate for variations in the components used in the BEC amplifier 50. The output signal from the gain and phase control assembly 68 is delivered to a combiner 74.

The signal from the coupler 54 that is directed to the error path 58 is gain and phase adjusted by a gain and phase control block or assembly 76. The gain and phase control assembly 76 has a gain control amplifier 78 having an adjustable gain. The gain and phase control assembly 76 also has a phase adjuster 80 that provides phase adjustment to the signal in the error path 58 to compensate for variations inherent in the components used in the BEC amplifier 50.

The output from the gain and phase control assembly 76 is delivered to a delay 82 that provides a time delay approximately equal to the amount of time required for a signal to propagate through the main amplifier 60. The output of the delay 82 is delivered to the combiner 74. The combiner 74 adds the signal from the gain and phase control assembly 68 to the output signal of the gain and phase assembly 76. The signal exiting the combiner 74 is input to an error or distortion canceling amplifier 88 having a gain G. The distortion canceling amplifier 88 generates a signal 90 having a main component and a noise component. The signal 90 is input into a summing point or combiner 100.

As noted above, the coupler 64 splits the amplified signal 62 such that part of the amplified signal 62 is diverted down the feed-forward path 66. Another part of the amplified signal 62 is directed to a delay 104. The delay 104 provides a time delay equal to the time required for a signal to propagate through the distortion-canceling amplifier 88. A signal 106 having a main component and an error or noise component exits the delay 104 and is directed to the combiner 100.

The signal 90 and the signal 106 are delivered to the combiner 100 and are combined such that their error components substantially cancel each other and their main components are summed together. The resultant output signal 108 has about twice the power of either the amplified signal 62 or the signal 90.

In the BEC amplifier 50 the signal sent to the error amplifier 88 is predistorted in exactly the right way to compensate for the output distortion from both the main amplifier 60 and the error amplifier 88. The BEC amplifier 50 relies on the similarity of the main and error amplifiers. This similarity allows the network to substantially predict the signal needed to cancel the distortion from both amplifiers. However, since two similar amplifiers are used, the signal from the main amplifier 60 contains half of the potential output power of the amplifier 50. Of course, before reaching the output of the amplifier 50, the signal from the main amplifier 60 is directed through the delay 104. The delay 104 is lossy. Further, the distortion-canceling signal applied to the input of the error amplifier 88 must be sufficiently large to cancel distortion from both amplifiers 60 and 88. Accordingly, large high-order distortion terms are generated (at the output of the error amplifier 88) and these terms limit the overall efficiency by requiring reduced output power.

Figure 3:
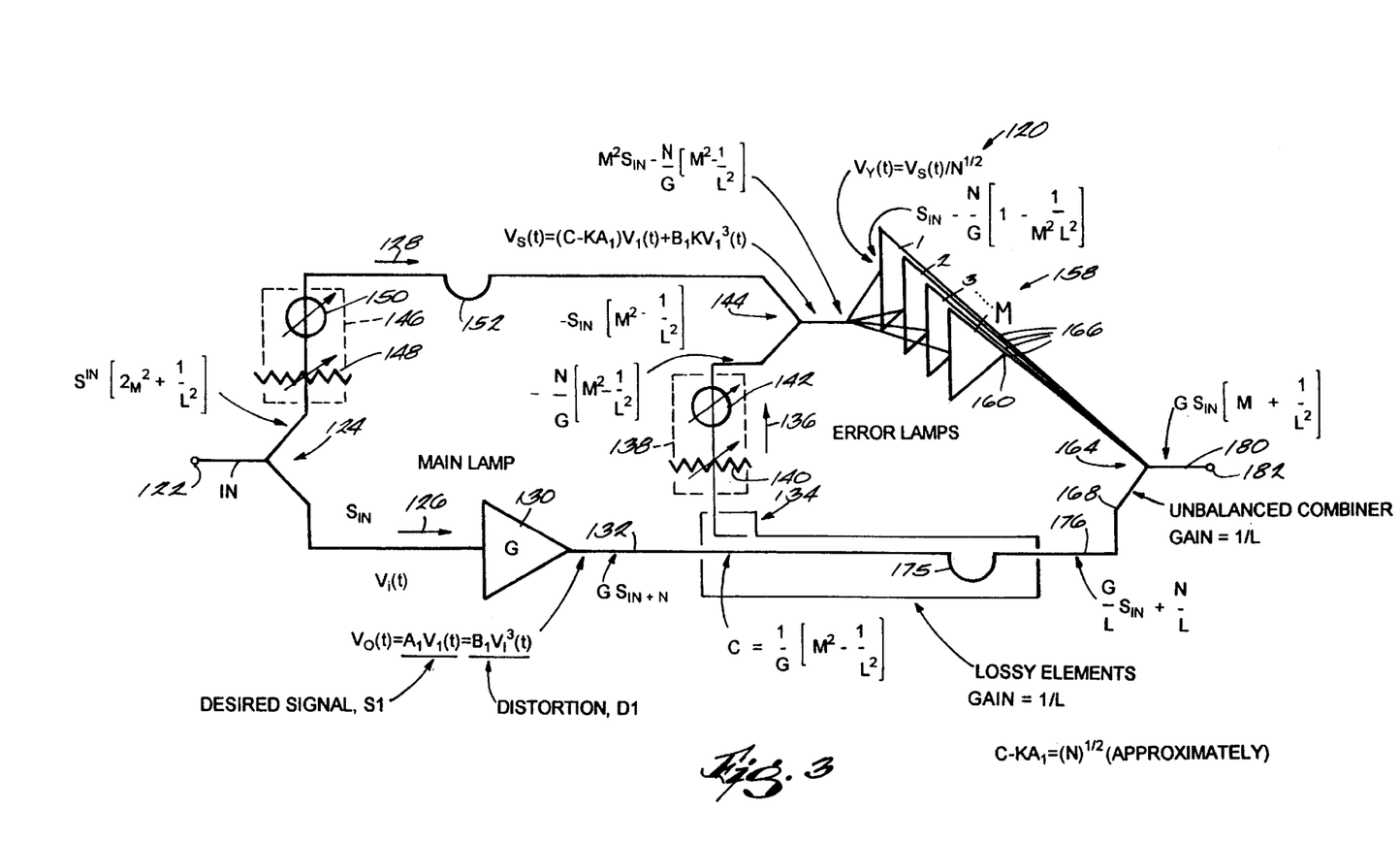
FIG. 3 is a circuit diagram of an amplifier embodying the invention.

FIG. 3 illustrates an amplifier 120 embodying the invention. The amplifier 120 receives an input signal IN at an input node 122. The input signal IN is split by a coupler 124 causing a version of the input signal IN to be directed to a main path 126 and an error path 128. A signal SIN is directed to the main path 126 and is amplified by a main amplifier 130 having a gain G. The main amplifier 130 generates an amplified signal $V_0(t)$ with a desired or main component or desired signal $A_1V_i(t)$ or (S1) and a distortion term or component $B_1V_i^3(t)$ or (D1). The amplified signal $V_0(t)$ is split by a coupler 134 that causes part of the amplified signal to be diverted down a feed-forward path 136 to a gain and phase control block or assembly 138. The coupler 134 has a coupling coefficient C of $1/G[M^2-1/L^2]$. The gain and phase control assembly 138 includes a gain control amplifier 140 having an adjustable gain. The gain and phase control assembly 138 also has a phase adjuster 142 that provides phase adjustment to compensate for variations in the components used in the amplifier 120. Preferably, the gain and phase control assembly 138 is adjusted so as to produce an output signal of $S_{IN} M^2-N/G [M^2-1/L^2]$. This output signal is delivered to a combiner 144.

The signal from the coupler 124 that is directed to the error path 128 is gain and phase adjusted by a gain and phase control block or assembly 146. The gain and phase control assembly 146 has a gain control amplifier 148 having an adjustable gain. The gain and phase control assembly 146 also has a phase adjuster 150 that provides phase adjustment to the signal in the error path 128 to compensate for variations inherent in the components used in the amplifier 120.

The output from the gain and phase control assembly 146 is delivered to a delay 152 that provides a time delay approximately equal to the amount of time required for a signal to propagate through the main amplifier 130. The output of the delay 152 is delivered to the combiner 144. The combiner 144 adds the signal from the gain and phase control assembly 138 to the output signal of the gain and phase 146. The signal exiting the combiner 144 is input to a plurality of error amplifiers 158.

The amplifier 120 includes M error amplifiers 158 connected at the output of the combiner 144 (or, more generally, the balancing network of the amplifier 120). The input signal to the error amplifiers 158 may be represented by $V_s(t)=(C-KA_1)V_i(t)+B_1KV_i^3(t)$. Each error amplifier 158 amplifies a fraction of the desired signal $(C-KA_1)V_i(t)$ plus a fraction of the distortion-canceling signal $B_1KV_i^3(t)$. Each amplifier generates an output 160 and all of the outputs 160 are combined in an N+1 combiner 164 having a plurality of inputs 166 and a reduced coupling input 168. The combiner 164 has a coupling ratio between the inputs 166 and the input 168 that is substantially equal to a power ratio of the signal from the main amplifier and the output signals from the error amplifiers 158. The gain of the input 168 is proportional to the inverse of the loss through the coupler 134 and the delay 175.

As noted above, the coupler 134 splits the amplified signal 132 such that part of the amplified signal 132 is diverted down the feed-forward path 136. Another part of the amplified signal 132 is directed to a delay 175. The delay 175 provides a time delay equal to the time required for a signal to propagate through one error amplifier 158. A signal 176 having a main component and an error or noise component exits the delay 175 and is directed to the reduced coupling input 168 of the combiner 164. Each output signal 160 and the signal 176 are delivered to the combiner 164 and are combined such that their error components substantially cancel each other and their components are summed together. The resultant output signal 180 is output at an output node 182 and has a power that is about equal to the sum total of the powers from all of the amplified signal 132 and the signals 160.

As compared to a BEC amplifier, the power lost in the delay 152 is reduced by a factor of $1-((M-1)/(M+1))$. In the limiting case, where M approaches infinity, the power of the main amplifier 130 approaches zero, and no power is lost in the delay 152. In a practical system, M could range from 2 to 10, although other values could be used. Table 1 below depicts the loss in the delay 152 versus M for a 1.5 dB delay-line.

TABLE 1

| M | Main Amplifier Power Loss | Overall Amplifier Loss | Improvement |
|---|---|---|---|
| 1 | 30% | 15% | 0% |
| 2 | 20% | 10% | 5% |
| 3 | 15% | 7.5% | 7.5% |
| 4 | 12% | 6% | 9% |
| 8 | 6.7% | 3.4% | 11.6% |
| 10 | 5.5% | 2.3% | 12.7% |

In the amplifier 120, each of the error amplifiers 158 provides a portion (1/M) of the distortion cancellation. The smaller cancellation signal (as compared to a standard BEC amplifier) results in smaller, high-order distortion terms. Accordingly, the amplifier 120 can cancel more distortion before the high-order terms become too large to handle. In addition, the output power may be increased and efficiency may be improved.

As is known, amplifier distortion of input signals is caused by non-linearities in the amplifier's characteristics. In many instances, it can be assumed that an amplifier produces only a first order term (the amplified or desired signal) and a third order term (a distortion term or component). As noted above, the main amplifier 130 may be considered as having a transfer function of $V_0(t)=A_1V_i(t)+B_1V_i^3(t)$. To perfectly eliminate the distortion component of the amplified signal produced by the main amplifier 130, the error amplifiers 158 must generate signals that when combined exactly cancel the distortion generated by the main amplifier 130. Just like any other amplifier, each error amplifier 158 produces its own third order distortion term. These distortion terms plus the distortion term from the main amplifier are added (unequally) at the output node 182. The input signal that is fed into the plurality of error amplifiers 158 is adjusted so that the error amplifiers provide a cancellation term to the combiner 164 at a certain level. In particular, the input signal to the plurality of error amplifiers 158 is adjusted such that the sum total output signal of the error amplifier 158 includes a component that is equal in amplitude, but 180 degrees out of phase from the combination of both the main and error amplifier distortion terms.

This is best understood by reference to the analysis below. Each error amplifier 158 and main amplifier 130 has an approximately identical transfer function. The signal input to each error amplifier 158 includes a sample of the output of the main amplifier 130 and a signal $V_i(t)$, which is based on the signal to the input node 122. Explained in relation to the transfer function for each error amplifier 158, $V_y(t)$ consists of a distortion term $B_1 V_i^3(t)/M^{1/2}$ (which acts as a distortion-canceling signal) and a desired-input signal $(C-KA_1)V_i(t)/M^{1/2}$. C represents the coupling coefficient of the sampling coupler 134 and K represents the coupling coefficient of the first combiner 144. The desired and distortion cancellation signals pass through the error amplifiers each error amplifier having a transfer function producing $V_{oo}$ at their output according to:

$$V_{oo}(t) = A_2 V_y(t) + B_2 V_y^3(t)$$

Each error amplifier will produce these terms:
1) Desired Signal: $V_i(C-KA_1)/M^{1/2}$
2) Distortion Cancellation Signal: $-V_i^3 A_2 B_1 K/M^{1/2}$
3) $3^{rd}$ Order Distortion: $V_i^3 B_2 (C-KA_1)^3/M^{3/2}$
4) $5^{th}$ Order Distortion: $-3V_i^5 B_2 B_1/(M+(1/L)^2)^{1/2}$
5) $7^{th}$ Order Distortion: $3V_i^7 B_2 (B_1 K)^2/(M+(1/L)^2)^{1/2}$
6) $9^{th}$ Order Distortion: $-V_i^9 B_2 (B_1 K)^3/M(M+(1/L)^2)^{1/2}$ The $5^{th}$, $7^{th}$, and $9^{th}$ order terms are called Extra Error Terms (EET). Based on the above, it is apparent that increasing the amplitude of the cancellation signal input to the error amplifier 104, increases the EET, preventing the unwanted terms from being reduced to zero. Since unwanted terms cannot be completely eliminated, pure cancellation cannot occur. But, as evidenced by the above equations and accompanying FIGS. 4–7, the EET may be reduced with an increase in M. Thus, improved efficiency does result by constructing an amplifier according to the teachings provided herein.

Figure 4:
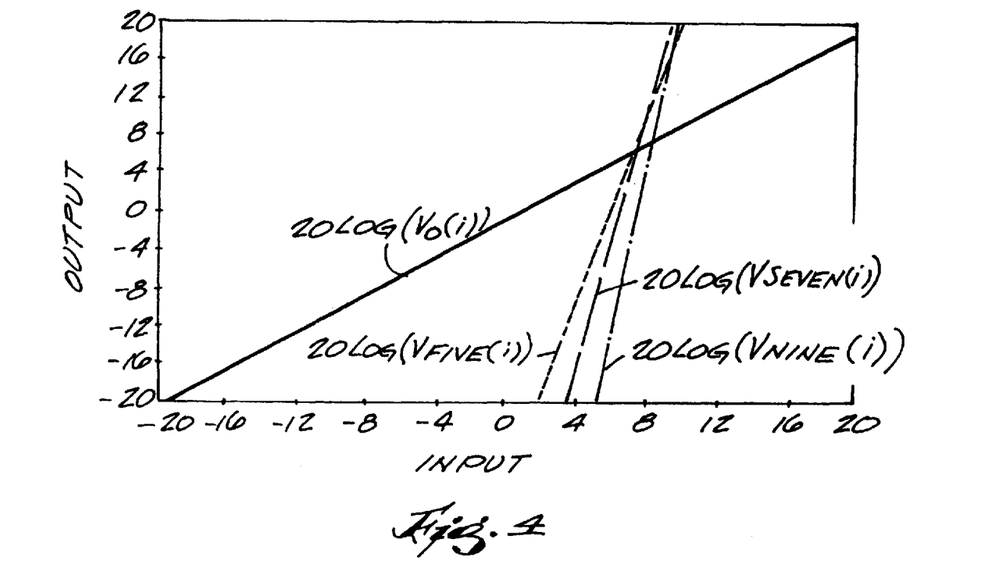
FIG. 4 is a graph of the output power of the main amplifier in a BEC amplifier versus input power.
Figure 5:
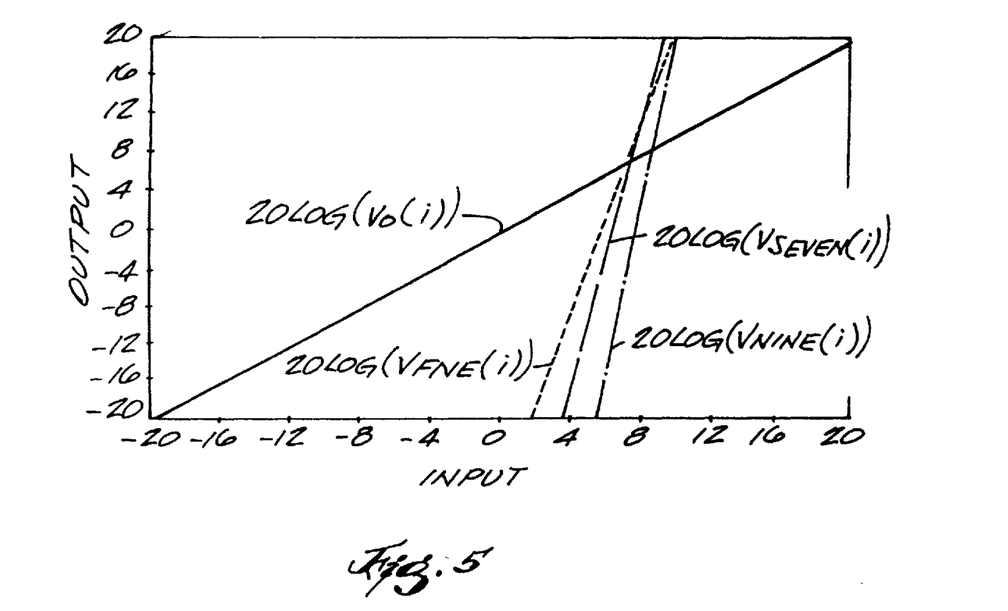
FIG. 5 is a graph of the output power of the main amplifier in an amplifier of the invention having two error amplifiers versus input power.
Figure 6:
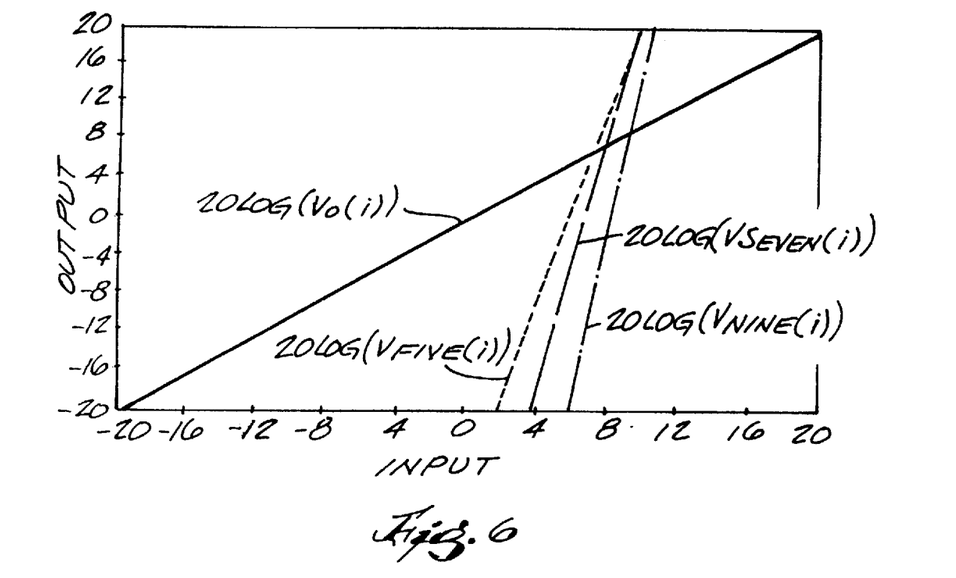
FIG. 6 is graph of the output power of the main amplifier in an amplifier of the present invention having four error amplifiers versus input power.
Figure 7:
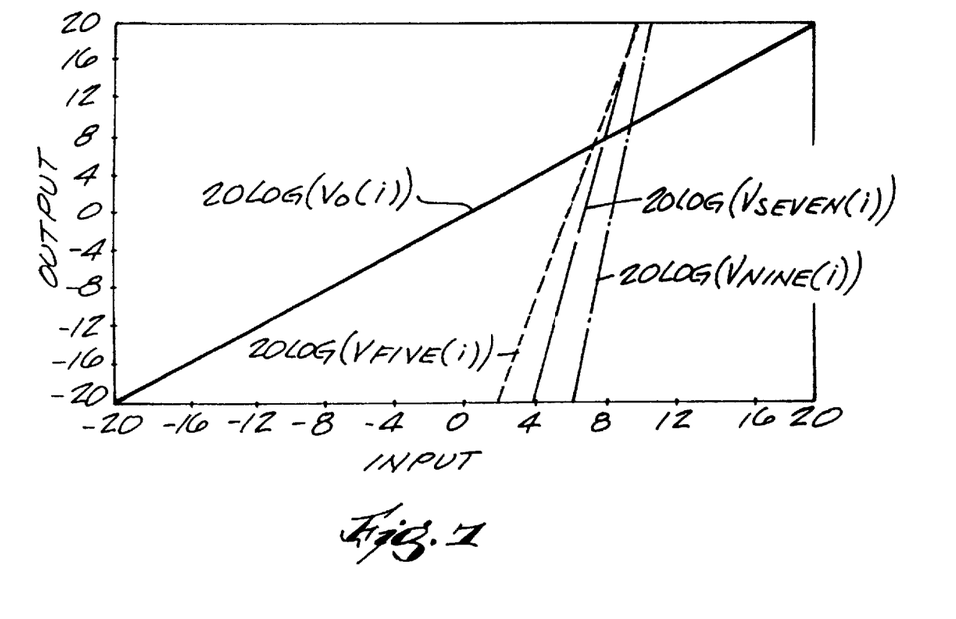
FIG. 7 is a graph of the output of the main amplifier in an amplifier of the present invention having ten error amplifiers versus input power.

FIG. 4 illustrates the power of certain components of the output signals of the amplifier 120. Specifically, power of the $5^{th}$, $7^{th}$, and $9^{th}$ order error terms of the output signal 160 versus the power of the input signal IN is displayed. As can be seen by reference to FIG. 4, distortion is dominated by the $5^{th}$ order term. FIGS. 5–7 show the improvement when two, four, and ten error amps are used. The improvement in performance is based on the conservation of total power. That is, the total power capability of all the amplifiers is held constant. For example, with two error amplifiers, each amplifier has ⅔ of the power as compared to the situation where just one error amplifier is used. The overall improvement depends on which of the terms is causing unacceptable distortion. The $5^{th}$ order term generates close-in products and the $7^{th}$ and $9^{th}$ order terms generate more widely spaced distortion. Table 2 shows the reduction of (or improvement in) each of the high-order terms.

TABLE 2

| M | $5^{th}$ Order Improvement | $7^{th}$ Order Improvement | $9^{th}$ Order Improvement |
|---|---|---|---|
| 2 | 5% | 12% | 17% |
| 4 | 10% | 18% | 26% |
| 10 | 15% | 26% | 65% |

The combination of multiple error amplifiers and unequal combining at the combiner 164 produces superior efficiency over typical BEC techniques. The total efficiency increase is due to lower loss and a higher operating point. The efficiency improvement is summarized in Table 3.

TABLE 3

| M | Reduced Loss | Higher Power | Total Improvement |
|---|---|---|---|
| 1 | 0 | 0 | 0 |
| 2 | 5% | 5% | 10.3% |
| 4 | 9% | 10% | 19.9% |
| 10 | 12.7% | 15% | 29.6% |

In a typical BEC amplifier, an efficiency of about 22% can be obtained. In an amplifier of the invention, efficiency can be improved by 10 to 30% (depending on M). The net result is an efficiency of about 24 to 29%.

As can be seen from the above, the present invention provides an amplifier with greater efficiency than many known amplifiers. Various features and advantages of the invention are set forth in the following claims.

What is claimed is:

1. An amplifier for amplifying a main signal, the amplifier comprising:

a main amplifier operable to receive the main signal and generate an amplified signal having a main component and an error component;

a second amplifier coupled in a feed-forward arrangement to the main amplifier and operable to receive an input signal and to generate an output signal having a main component and an error component;

a third amplifier coupled in parallel to the second amplifier and operable to generate an output signal having a main component and an error component;

a balancing network coupled to the main amplifier and to the second and third amplifiers, the balancing network operable to isolate a sample of the error component of the amplified signal, invert the sample, and combine the sample with the input signal to the second and third amplifiers; and a combiner where the amplified signal from the main amplifier and the output signals of the second and third amplifiers are combined such that the error component of the amplified signal and the error components of the output signals of the second and third amplifiers substantially cancel one another and the main component of the amplified signal and the main components of the output signals of the second and third amplifiers are added to one another.

2. An amplifier as claimed in claim 1, wherein the main amplifier has a gain, the second amplifier has a gain, and the third amplifier has a gain, and the gains of the second and third amplifiers are substantially the same.

3. An amplifier as claimed in claim 1, wherein the gains of the second and third amplifiers are substantially equal to one another.

4. An amplifier as claimed in claim 1, wherein the balancing network includes at least one gain control component and at least one phase control component.

5. An amplifier as claimed in claim 1, wherein the combiner has a reduced coupling input.

6. An amplifier for amplifying a first input signal, the amplifier comprising:
   a main amplifier operable to receive the first input signal and generate an amplified signal having a main component and an error component;
   a plurality of error amplifiers each coupled in parallel with one another, the plurality of error amplifiers coupled in a feed-forward arrangement to the main amplifier and operable to receive a second input signal, each of the plurality of error amplifiers operable to generate an output signal having a main component and an error component;
   a balancing network coupled to the main amplifier and to the plurality of error amplifiers, the balancing network operable to isolate a sample of the error component of the amplified signal, invert the sample, and combine the sample with the input signal to the plurality of error amplifiers; and
   an unequal combiner coupled to the balancing network, wherein the amplified signal from the main amplifier and the output signal of each of the plurality of error amplifiers are combined such that the error component of the amplified signal and the output signals of the plurality of error amplifiers substantially cancel one another and the main component of the amplified signal and the output signals are added to one another.

7. An amplifier as claimed in claim 6, wherein the main amplifier has a gain, each of the plurality of error amplifiers has a gain, and the gains of the error amplifiers are substantially the same as the gain of the main amplifier.

8. An amplifier as claimed in claim 6, wherein the gains of each of the error amplifiers are substantially equal to one another.

9. An amplifier as claimed in claim 6, wherein the balancing network includes at least one gain control component and at least one phase control component.

10. An amplifier as claimed in claim 6, wherein the unequal combiner has a reduced coupling input.

11. An amplifier comprising
   an input node,
   a main amplifier coupled to the input node, the main amplifier operable to generate an amplified signal having a main component and an error component;
   a first gain and phase control assembly coupled to the input node;
   a second gain and phase control assembly coupled to the main amplifier;
   a first combiner coupled to the first gain and phase control assembly and to the second gain and phase control assembly;
   a plurality of error correction amplifiers coupled to the first combiner; and
   an unbalanced power combiner having a plurality of main inputs, each main input coupled to one of the plurality of error correction amplifiers and a second input coupled to the main amplifier, the unbalanced power combiner having a gain proportional to 1/L, where L is representative of a loss from the main amplifier to the second input.

12. An amplifier as claimed in claim 11, wherein the main amplifier has a gain and each of the plurality of error correction amplifiers has a gain that is substantially the same as the gain of the main amplifier.

13. An amplifier as claimed in claim 11, further comprising a delay coupled to the first combiner.

14. An amplifier as claimed in claim 13, wherein first combiner and the delay have a gain proportional to 1/L.

15. A method of amplifying a signal, the method comprising:
   dividing an input signal into a first component and a second component;
   amplifying the first component of the input signal to create an output signal;
   sampling the output signal to create a sampled signal;
   combining the sampled signal and the second component of the input signal to create a combined signal;
   amplifying the combined signal using a plurality of error correction amplifiers coupled in parallel paths to create a plurality of correction signals; and
   combining the output signal and the correction signals in an unequal combiner to create an amplified signal.

16. A method as claimed in claim 15, further comprising the step of passing the output signal of the main amplifier through lossy elements having a gain that is substantially equal to the gain in a branch of the unequal combiner.

17. A method as claimed in claim 15, further comprising adjusting the phase of the second component.

18. A method as claimed in claim 15, the further comprising adjusting the phase and gain of the sampled signal.

19. A method of amplifying a signal, the method comprising:
   dividing an input signal into a first component and a second component;
   amplifying the first component of the input signal to create an output signal;
   sampling the output signal to create a sampled signal;
   combining the sampled signal and the second component of the input signal to create a combined signal;
   amplifying the combined signal using a plurality of error correction amplifiers to create a plurality of correction signals; and
   combining the output signal and the correction signals in an unequal combiner to create an amplified signal;
   wherein the act of combining the output signal and correction signals includes using an unequal combiner having a first input and a plurality of second inputs.

20. An amplifier for amplifying a main signal, the amplifier comprising:
   an input node;
   a first coupler coupled to the input node;
   a main amplifier coupled to the first coupler and operable to generate an amplified signal having a main component and a noise component;
   a sampling coupler coupled to the main amplifier to divert a part of the amplified signal to a feed-forward path having a gain and phase control mechanism, the sampling coupler having a coefficient proportional to the inverse of the gain of the main amplifier;
   a second gain and phase control mechanism coupled to the first coupler;
   a first combiner to combine the signal from the first and second gain and phase control mechanisms;
   a plurality of error amplifiers coupled to the first combiner, each error amplifier operable to generate an output signal having a main component and a noise component; and an unequal combiner coupled to the sampling coupler, the combiner having a plurality of main inputs, each main input coupled to one of the plurality of error amplifiers, and a second input coupled to the main amplifier, the second input having a reduced coupling coefficient.

21. An amplifier as claimed in claim 20, further comprising a delay coupled between the first coupler and the unequal combiner.

22. An amplifier as claimed in claim 21, wherein the reduced coupling coefficient of the second input is equal to the inverse of the loss through the first coupler and the unequal combiner.

23. An amplifier as claimed in claim 20, wherein the amplified signal from the main amplifier and the output signals of the plurality of error amplifiers are combined such that the error components of the amplified signal and the output signal substantially cancel one another and the main components of the amplified signal and the output signals are added to one another.

24. A method of amplifying a signal, the method comprising:

dividing an input signal into a first component and a second component;

amplifying the first component of the input signal to create an output signal;

sampling the output signal to create a sampled signal;

adjusting the phase and gain of the sampled signal;

combining the sampled signal and the second component of the input signal to create a combined signal;

amplifying multiple fractions of the combined signal to create a plurality of parallel error correction signals; and combining the output signal and the correction signals to create an amplified signal.

* * * * *

UNITED STATES PATENT AND TRADEMARK OFFICE
CERTIFICATE OF CORRECTION

PATENT NO. : 6,424,213 B1 Page 1 of 1
DATED : July 23, 2002
INVENTOR(S) : Warren Guthrie It is certified that error appears in the above-identified patent and that said Letters Patent is hereby corrected as shown below:

Column 5,
Line 24, delete "SIN", insert -- $S_{IN}$ --

Signed and Sealed this

Twenty-first Day of January, 2003

JAMES E. ROGAN
*Director of the United States Patent and Trademark Office*